United States Patent
Huang et al.

(10) Patent No.: US 8,537,064 B2
(45) Date of Patent: Sep. 17, 2013

(54) ANTENNA RETAINING DEVICE

(75) Inventors: Teng-Tsung Huang, New Taipei (TW);
Yong-Bing Hu, Shenzhen (CN);
Zhang-Sheng Yan, Shenzhen (CN);
Gong-Shui Cheng, Shenzhen (CN);
Zhan Shang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 261 days.

(21) Appl. No.: 13/207,179

(22) Filed: Aug. 10, 2011

(65) Prior Publication Data
US 2012/0169558 A1 Jul. 5, 2012

(51) Int. Cl.
*H01Q 3/00* (2006.01)
(52) U.S. Cl.
USPC .......................................................... 343/766
(58) Field of Classification Search
USPC .................................. 343/766, 765, 882, 883
See application file for complete search history.

(56) References Cited

U.S. PATENT DOCUMENTS

| | | | |
|---|---|---|---|
| 4,580,461 A * | 4/1986 | Sears et al. | 74/490.1 |
| 7,755,563 B2 * | 7/2010 | Berry et al. | 343/878 |
| 7,999,676 B2 * | 8/2011 | Cheung et al. | 340/572.1 |
| 2003/0160731 A1 * | 8/2003 | Wensink | 343/892 |
| 2005/0168385 A1 * | 8/2005 | Baker | 343/700 MS |

* cited by examiner

*Primary Examiner* — Huedung Mancuso
(74) *Attorney, Agent, or Firm* — Altis Law Group, Inc.

(57) ABSTRACT

An antenna retaining device includes two spaced upright beams, two movable mechanisms, each movable mechanism slidably mounts on one of the upright beams, a retaining mechanism includes two connecting elements a connecting rod connecting rod rotatably and movably mounted on the connecting elements. A retaining board is located on the connecting rod, the retaining board holds the antenna. The first connecting element is rotatably mounted on one of the movable mechanisms, the second connecting element is rotatably mounted on the other movable mechanism. Two driving mechanism, each driving one of the movable mechanisms to move along the their respective bar. When the motors drive the movable mechanisms to move at different speeds, the first connecting element and the second connecting element rotate relative to the their respective loading boards and move along the connecting rod, to adjust a direction of the connecting rod and retaining board.

12 Claims, 5 Drawing Sheets

ANTENNA RETAINING DEVICE

BACKGROUND

1. Technical Field

This disclosure relates to antenna retaining devices, particularly to antenna retaining devices for retaining an antenna used in testing electromagnetic compatibility (EMC) of an electronic device.

2. Description of Related Art

EMC is the branch of electrical sciences which studies the unintentional generation, propagation and reception of electromagnetic energy with reference to the unwanted effects (Electromagnetic interference, or EMI) that such energy may induce. To test EMC of a particular device typically involves a high-powered source of RF or EM pulse energy and a radiating antenna to direct the energy at the device under test. The radiating antenna is typically located in a movable retaining device, to change the distance between the radiating antenna and the particular device. However, the radiating antenna cannot be steadily directed at a retaining device and the orientation of the radiating antenna cannot be adjusted.

Therefore, there is a room for improved in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary antenna retaining device. Moreover, in the drawings like reference numerals designate their respective parts throughout the several views. Wherever possible, the same reference numbers are used throughout the drawings to refer to the same or like elements of an embodiment.

DETAILED DESCRIPTION

Figure 1:
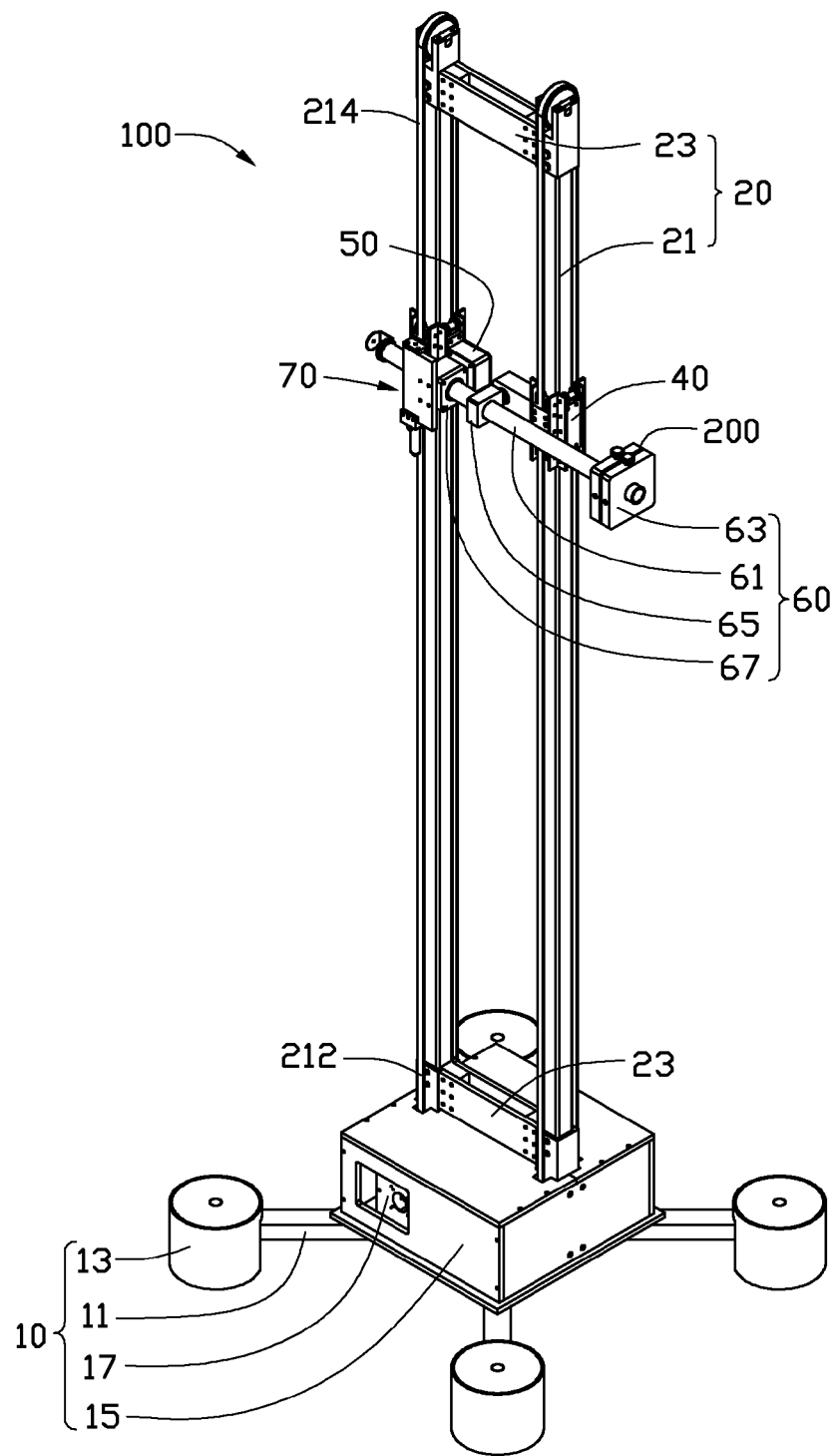
FIG. 1 is a schematic view of an exemplary embodiment of an antenna retaining device.
Figure 2:
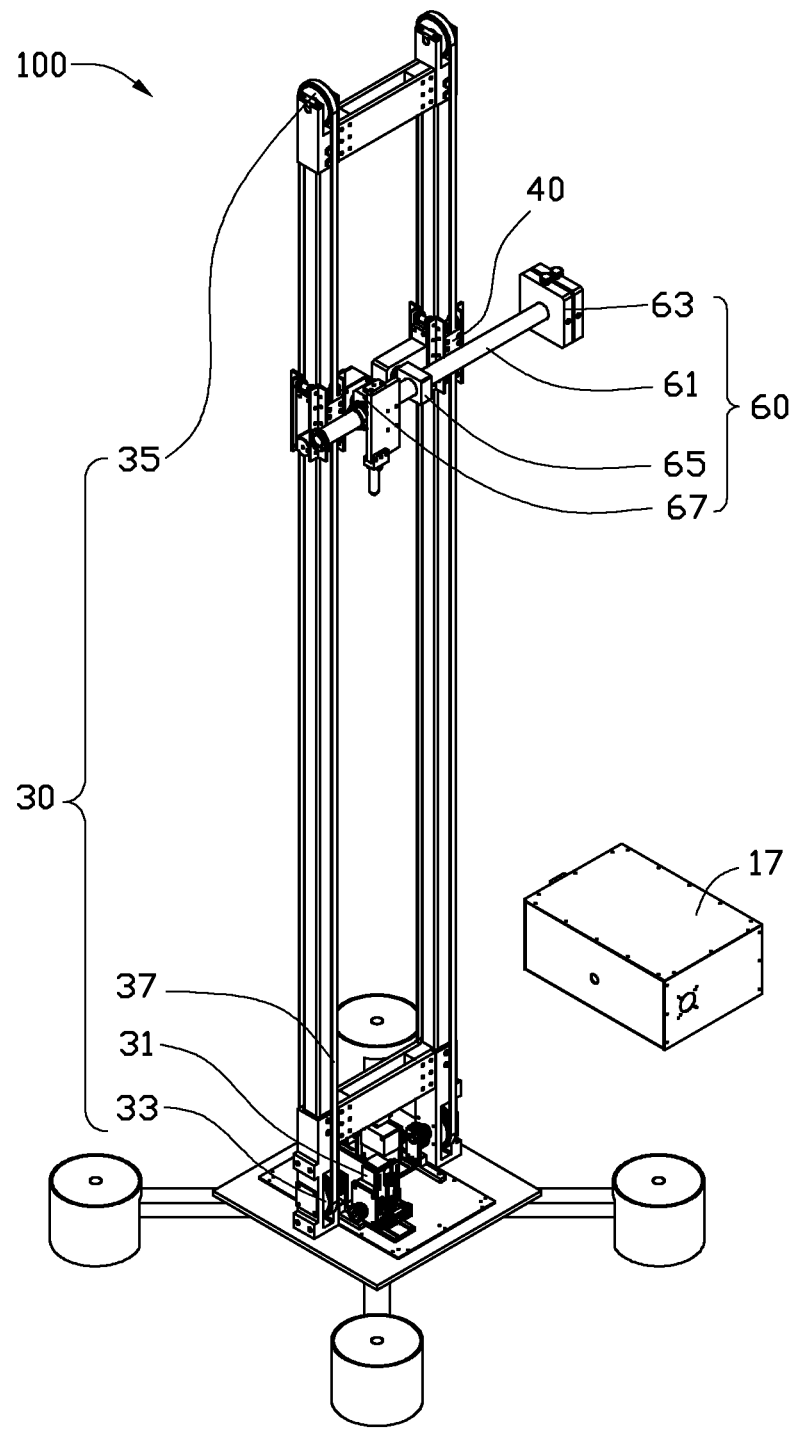
FIG. 2 is similar to the FIG. 1, but viewed from another aspect.

Referring to FIGS. 1-2, an exemplary embodiment of an antenna retaining device 100 retaining an antenna 200 used in testing the EMC of an electronic device is illustrated. The antenna retaining device 100 includes a base 10 and a support mechanism 20 mounted on the base 10. Two driving mechanisms 30 are mounted on the base 10. Two movable mechanisms 40 are movably mounted on the support mechanism 20. A loading board 50 is respectively mounted on each of the movable mechanisms 40. A retaining mechanism 60 is mounted on the loading boards 50. In addition, a rotation mechanism 70 is mounted on one of the loading boards 50. The antenna 200 is retained on the retaining mechanism 60. The driving mechanisms 30 drive the movable mechanisms 40 to move, causing the retaining mechanism 60 and the antenna 200 to move in unison.

The exemplary base 10 includes two crossing supporting rods 11, four pedestals 13, a mounting box 15 and a shielding can 17. Each pedestal 13 is mounted at one end of the supporting rod 11, to support the antenna 200. The mounting box 15 is retained on the supporting rods 11. The mounting box 15 is for mounting the support mechanism 20 and the driving mechanisms 30. The shielding case 17 is retained in the mounting box 15, to shield the electromagnetic radiation of the driving mechanisms 30.

The support mechanism 20 includes two upright beams 21 and two spacing members 23. The upright beams 21 are mounted and spaced apart on the mounting box 15. One of the spacing members 23 connects the first ends 212 of the upright beams 21. The other spacing member 22 connects the opposite second ends 214 of the upright beams 21.

Referring to FIG. 2, each driving mechanism 30 includes a motor 31, a drive pulley 33, a slave pulley 35, and a belt 37. The motors 31 are located in the mounting box 15. Each drive pulley 33 is located at one of the first ends 212 and is driven by one of the motors 31. Each slave pulley 35 is located at one of the second ends 214. Belt 37 connects the drive pulley 33 and the slave pulley 35. When the motors 31 rotate the drive pulleys 33, the drive pulleys 33 and the slave pulleys 35 drive the belts 37 to move relative to the upright beams 21.

Figure 3:
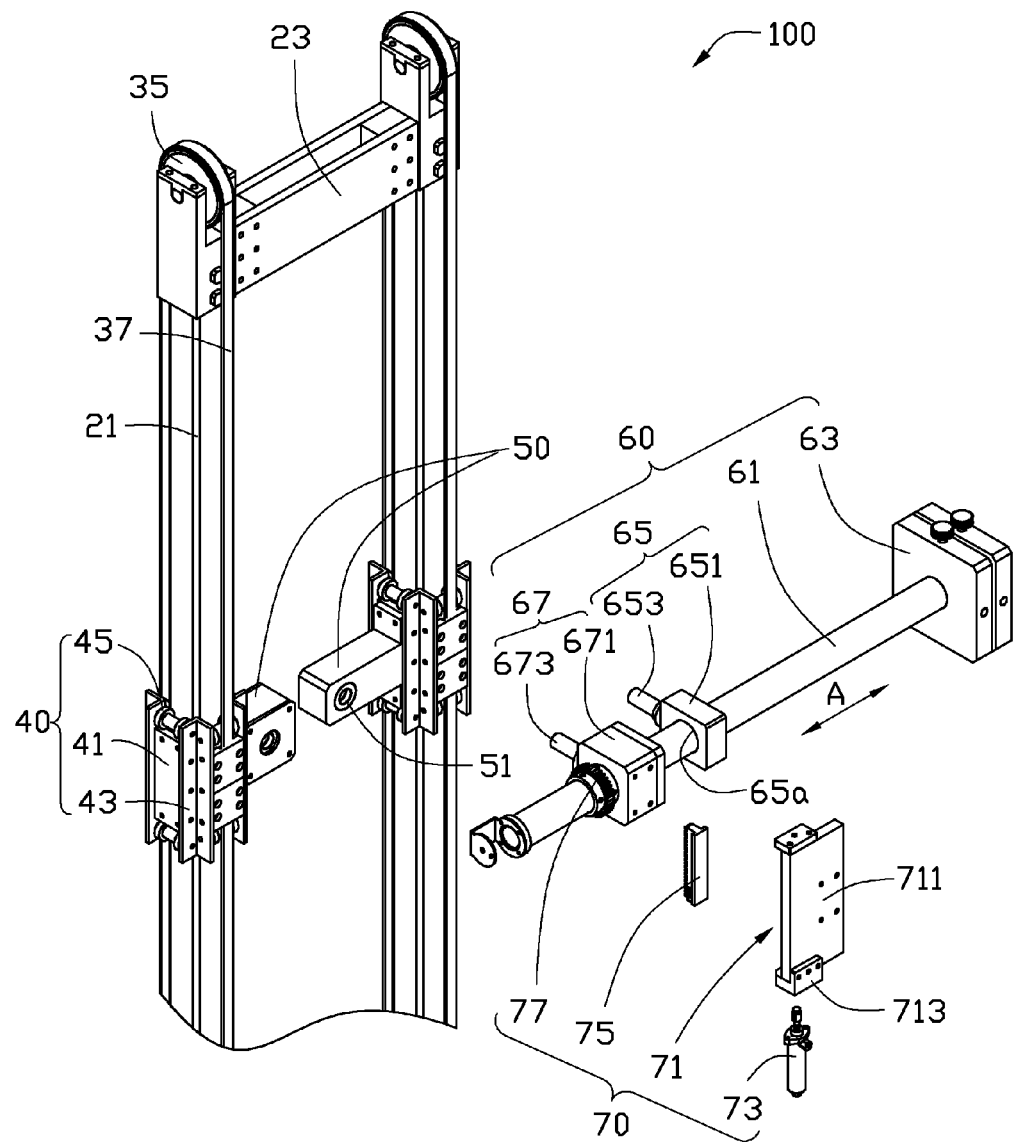
FIG. 3 is a partially exploded and enlarged view of the antenna retaining device of FIG. 2.

Referring to FIG. 3, each movable mechanism 40 is connected at a fixed location to one of the belts 37. Therefore, movement of belts 37 results in movement of the movable mechanisms 40 along the lengths of the upright beams 21. In this exemplary embodiment, each movable mechanism 40 may include four connecting boards 41, four connecting members 43 and eight bearings 45. Each adjacent two connecting boards 41 are connected by one of the connecting members 43. Each end of each connecting board 41 has one of the bearings 45 mounted thereon. When the movable mechanisms 40 are mounted on the upright beams 21, the bearings 45 resist the upright beams 21.

Each loading board 50 is retained on one of the movable mechanisms 40 and is located between the upright beams 21. Each loading board 50 defines a hole 51 containing a rotatable bearing 52 for mounting shafts of the retaining mechanism 60, as described below.

Figure 4:
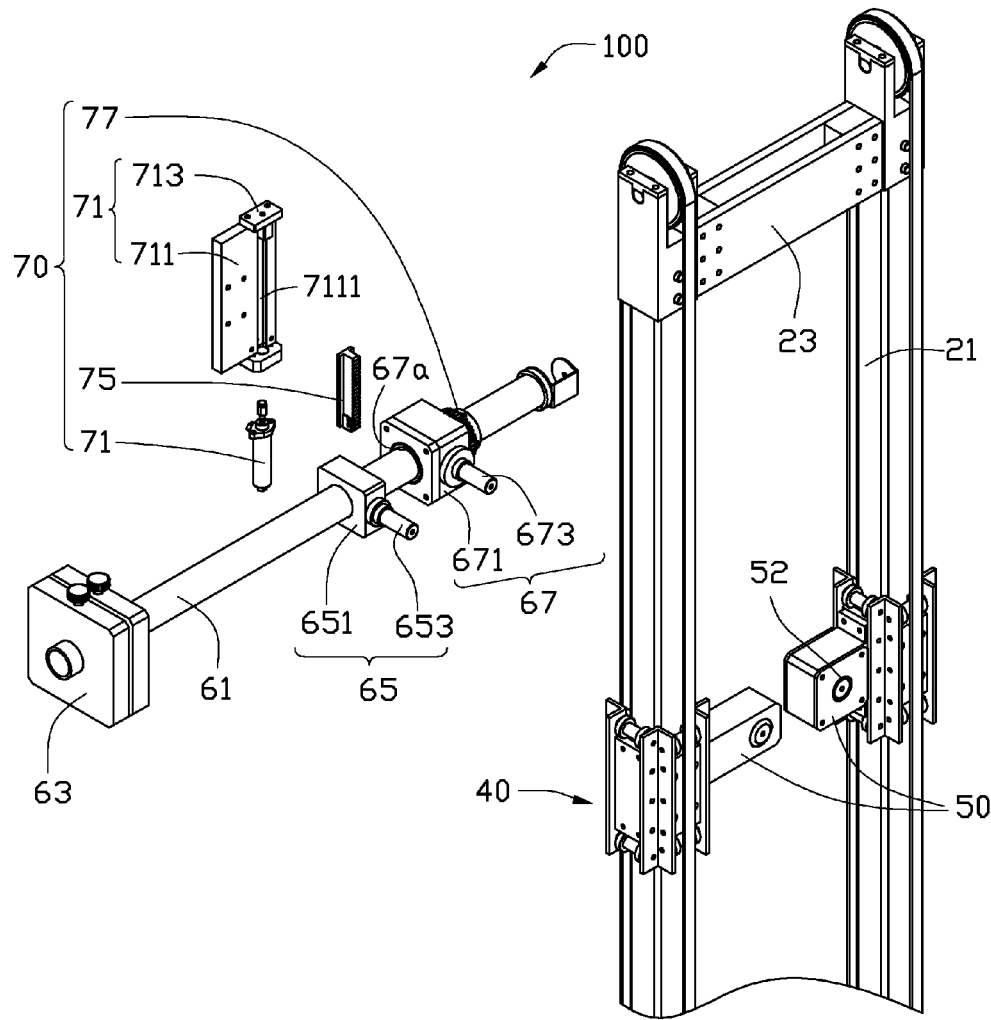
FIG. 4 is similar to the FIG. 3, but viewed form another aspect.
Figure 5:
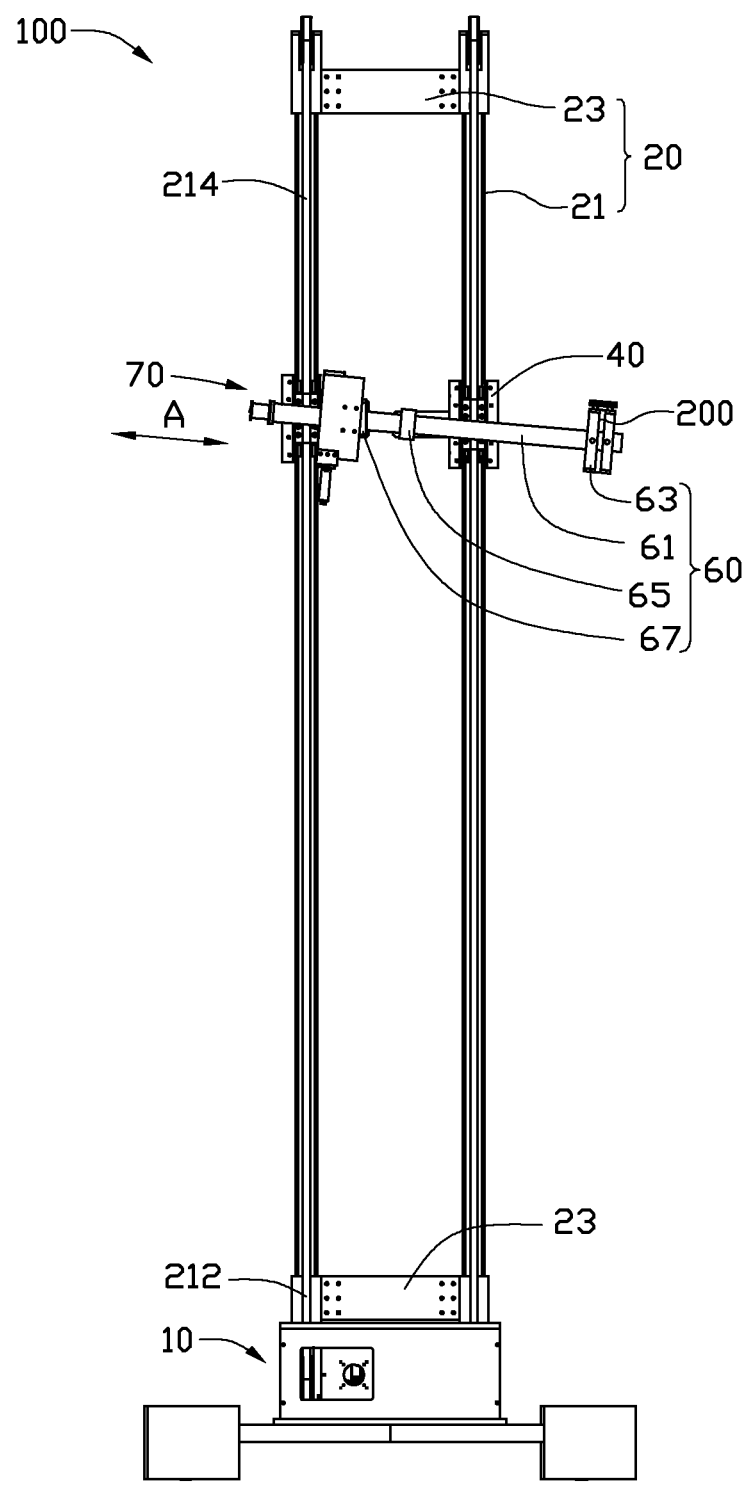
FIG. 5 is a planar view of the antenna retaining device after a retaining mechanism is adjusted.

Referring to FIGS. 1 and 3, the retaining mechanism 60 includes a connecting rod 61, a retaining board 63 located at one end of the connecting rod 61, a first connecting element 65 and a second connecting element 67. The retaining board 63 is for supporting the antenna 200. The first connecting element 65 has a rotatable bearing 65a and the second connecting element has a rotatable bearing 67a (FIG. 4). The connecting rod 61 is supported by the rotatable bearings 65a, 67a. The connecting rod 61 can rotate within the rotatable bearings 67a, 65a and the rotatable bearings 65a, 67a can slide along the surface of rod 61 (see A-A in FIG. 3). The first connecting element 65 includes a first block 651 supporting a first shaft 653. The second connecting element 67 includes a second block 671 supporting a second shaft 673. The first shaft 653 is mounted in one of the holes 51 and the second shaft 673 is rotatably mounted in the other hole 51. Therefore, The first, second connecting element 65, 67 can change their angular orientation relative to the movable mechanisms 40 (e.g. rotation).

Referring to FIG. 4, the rotation mechanism 70 drives the connecting rod 61 to rotate, causing the antenna 200 retained on the retaining board 63 to rotate. In this exemplary embodiment, the rotation mechanism 70 includes a mounting board 71, a drive mechanism such as a pneumatic cylinder 73 mounted on the mounting board 71, a rack 75 retained on and driven by the cylinder 73, a gear 77 gearingly engaged with the rack 75. The mounting board 71 includes a main body 711 and two limiting blocks 713 respectively defined on two ends of the main body 711. The main body 711 is retained on one of the first blocks 651 and defines a sliding groove 7111. The rack 75 is slidably located in the sliding groove 7111. The limiting blocks 713 prevent the rack 75 from sliding out of the sliding groove 7111. The cylinder 73 is retained on one of the limiting blocks 713. The gear 77 is mounted on the connecting rod 61. The cylinder 73 drives the rack 75 to move, which causes the gear 77 and the connecting rod 61 to rotate so the antenna 200 rotates in unison with the connecting rod 61.

Referring to FIG. 1-2, to adjust the position and/or orientation of the antenna 200, the motors 31 can be operated at different speeds (e.g., one motor 31 is operated at 5 revolutions per second, the other motor 31 is operated at 10 revolutions per second). This results in belts 37 moving at different speeds. As each movable mechanism 40 is respectively mounted on one of the belts 37, belts 37 moving at different speeds results in the movable mechanisms 40 moving at different speeds along the length of their respective upright beams 21.

The combination of the ability of the first, second connecting element 65, 67 to slide along the length of the rod 61 and the ability of the first, second connecting element 65, 67 to rotate relative to the movable mechanisms 40 allows the overall device to compensate for changes in linear distance between the support points of rotatable bearings 65a, 67a resulting from different speeds of the movable mechanisms 40 and therefore the retaining device will not seize or jam under normal use conditions.

Additionally, the cylinder 73 can drive the rack 75 to move so the moving rack 75 rotates the gear 77 and the connecting rod 61 which causes the antenna 200 to rotate to a desired angle, to e.g. reverse its polarity.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. An antenna retaining device for retaining an antenna and driving the antenna to move, the antenna retaining device comprising:

two spaced upright beams;

two movable mechanisms, each movable mechanism slidably mounted on one of the upright beams;

a retaining mechanism comprising a first connecting element, a second connecting element, a connecting rod rotatably and movably mounted on the first connecting element and the second connecting element, a retaining board located on the connecting rod, the retaining board used to hold the antenna, the first connecting element rotatably mounted on one of the movable mechanisms, the second connecting element rotatably mounted on the other movable mechanism;

two driving mechanism, each driving mechanism driving one of the movable mechanisms to move along their respective upright beams;

wherein when the motors drive the movable mechanisms to move at different speeds, the first connecting element and the second connecting element rotate relative to the their respective loading boards and slide along the connecting rod, to adjust a direction of the connecting rod and retaining board.

2. The antenna retaining device of claim 1, wherein each driving mechanism includes a motor, a drive pulley, a slave pulley, and a belt; each drive pulley is located at a first end of one of the upright beams and is driven by one of the motors; each slave pulley is located at a second end of one of the upright beams; each belt connects one of the drive pulleys and one of the slave pulleys; when the motors rotate the drive pulleys, the drive pulleys and the slave pulleys drive the belts to move relative to the upright beams.

3. The antenna retaining device of claim 1, wherein each movable mechanism comprises four connecting boards and at least four bearings, each adjacent two connecting boards are connected together, at least one end of each connecting board has one of the bearings mounted thereon; when the movable mechanisms are mounted on the upright beams, the bearings resist the upright beams.

4. The antenna retaining device of claim 3, wherein each movable mechanism further comprises four connecting members, each adjacent two connecting boards are connected by one of the connecting member.

5. The antenna retaining device of claim 1, further comprising two loading boards, wherein each loading board is retained on one of the movable mechanisms and located between the upright beams; the loading boards further rotatably coupled with the retaining mechanism.

6. The antenna retaining device of claim 5, wherein each loading board defines a hole; the first connecting element includes a first block supporting a first shaft, the second connecting element includes a second block supporting a second shaft; the first block and the second block are slidably and rotatably mounted on the connecting rod; the first shaft is rotatably mounted in one of the holes, the second shaft is rotatably mounted in the other hole.

7. The antenna retaining device of claim 6, wherein the first connecting element has a first rotatable bearing and the second connecting element has a second rotatable bearing; the connecting rod is supported by the first rotatable bearing and the second rotatable bearing.

8. The antenna retaining device of claim 7, wherein the connecting rod is capable of rotating within the first rotatable bearing and the second rotatable bearing and the first rotatable bearing and the second rotatable bearing is capable of sliding along the rod.

9. The antenna retaining device of claim 1, further comprising a rotation mechanism driving the connecting rod to rotate, causing the antenna retained on the retaining board to rotate.

10. The antenna retaining device of claim 9, wherein the rotation mechanism includes a cylinder, a rack slave by the cylinder, a gear meshing with the rack, the gear is mounted on the connecting rod; the cylinder drives the rack to move, which causes the gear and the connecting rod rotating so the antenna retained on the retaining board is rotated with the connecting rod.

11. The antenna retaining device of claim 10, wherein the rotation mechanism further includes a mounting board retained on one of the first connecting element and the second connecting element; the cylinder is retained on the mounting board; the mounting board defining a sliding groove, in which the gear is slidably located.

12. The antenna retaining device of claim 1, further comprising a base which includes a mounting box and a shielding can, the driving mechanism is mounted in the mounting box, the shielding can is retained in the mounting box to shield the electromagnetic radiation of the driving mechanisms.

* * * * *